United States Patent
Dick et al.

(10) Patent No.: US 7,098,679 B2
(45) Date of Patent: Aug. 29, 2006

(54) CIRCUIT TESTER INTERFACE

(75) Inventors: Kevin R. Dick, Katy, TX (US); Walter J. Belmore, III, Spring, TX (US); Rodney E. Thomsen, Boise, ID (US); Robert R. Covington, Tomball, TX (US)

(73) Assignee: Hewlett-Packard Development Compnay, L.P., Houston, TX (US)

( * ) Notice: Subject to any disclaimer, the term of this patent is extended or adjusted under 35 U.S.C. 154(b) by 35 days.

(21) Appl. No.: 10/753,142

(22) Filed: Jan. 7, 2004

(65) Prior Publication Data

US 2005/0146344 A1 Jul. 7, 2005

(51) Int. Cl.
*G01R 31/02* (2006.01)

(52) U.S. Cl. .................................. 324/761

(58) Field of Classification Search ........... 324/754, 324/756, 757, 758, 761, 762, 765, 158.1
See application file for complete search history.

(56) References Cited

U.S. PATENT DOCUMENTS

| | | | | |
|---|---|---|---|---|
| 4,841,241 A | * | 6/1989 | Hilz et al. .............. | 324/754 |
| 4,935,696 A | * | 6/1990 | DiPerna ................ | 324/761 |
| 5,157,325 A | * | 10/1992 | Murphy ................. | 324/761 |
| 5,262,716 A | * | 11/1993 | Gregory et al. ........ | 324/754 |
| 6,043,669 A | * | 3/2000 | Carroll ................. | 324/761 |

OTHER PUBLICATIONS

"Agilent No-Wire Fixture Technology Data Sheet," Agilent Technologies, 4 pp.

* cited by examiner

*Primary Examiner*—Jermele Hollington
*Assistant Examiner*—Tung X. Nguyen

(57) ABSTRACT

A printed circuit board comprises a plurality of inner and outer holes. An electrically conductive barrel may be disposed in each outer hole, and an electrically conductive barrel and a probe may be disposed in each inner hole. The electrically conductive barrels may protrude from the bottom of the interface board at substantially similar fixed heights. Transfer paths may couple at least some of the barrels in the outer holes to selected barrels in the inner holes.

7 Claims, 4 Drawing Sheets

CIRCUIT TESTER INTERFACE

BACKGROUND

Printed circuit boards may comprise a variety of circuits, such as amplifiers, filters, and timers. A circuit tester may send electrical test signals to test points on the circuit board to validate the functionality of the circuits. The circuit tester, by analyzing the effects of the electrical test signals on the circuit board, may determine whether the circuit board is operating properly.

A circuit board may interface with the circuit tester through a test fixture that facilitates the transmission of the test signals from the test points to the circuit tester. As the size of circuit testers has increased, the cost of producing test fixtures for such circuit testers has also increased.

SUMMARY

The problems noted above may be solved in large part by a circuit tester interface. One exemplary embodiment may be a printed circuit board that comprises a plurality of inner and outer holes. An electrically conductive barrel may be disposed in each outer hole, and an electrical conductive barrel and a probe may be disposed in each inner hole. The electrical conductive barrels may protrude from the bottom of the interface board at substantially similar fixed heights. Transfer paths may couple at least some of the barrels in the outer holes to selected barrels in the inner holes.

BRIEF DESCRIPTION OF THE DRAWINGS

For a detailed description of embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the verb "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. The embodiments disclosed should not be interpreted, or otherwise used, as limiting the scope of the disclosure unless otherwise specified. In addition, one skilled in the art will understand that the following description has broad application, and the discussion of any embodiment is meant only to be exemplary of that embodiment, and not intended to intimate that the scope of the disclosure is limited to that embodiment.

Figure 1:
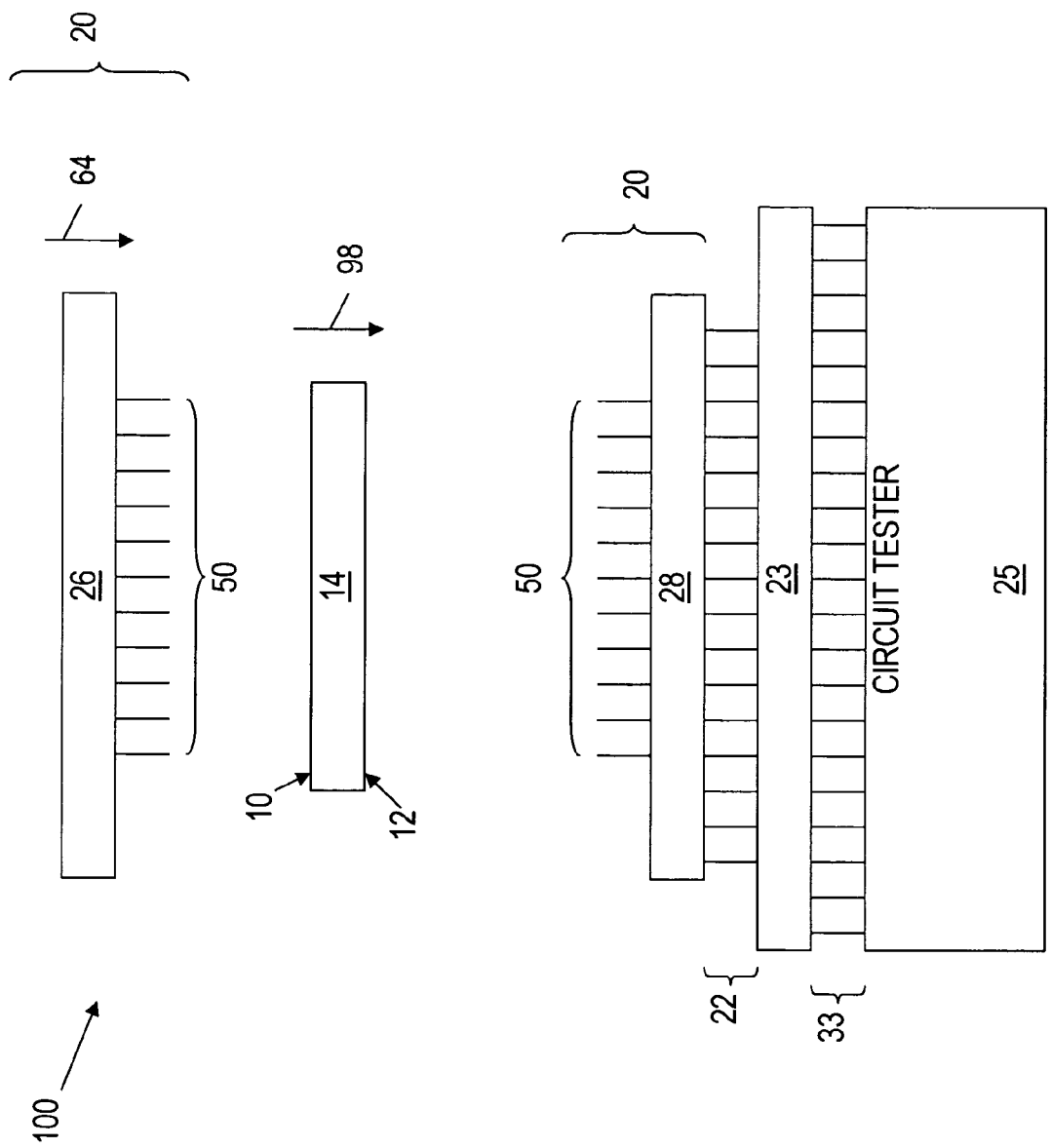
FIG. 1 illustrates a test system in accordance with embodiments of the invention.

FIG. 1 illustrates an exemplary test system 100 constructed in accordance with embodiments of the invention. The test system 100 may provide a method and associated apparatus for performing electrical tests on a printed circuit board 14. A test fixture 20 may comprise an upper test board 26 and a lower test board 28, and may facilitate the transmission of test signals to and from a circuit tester 25 to the printed circuit board 14 under test. The upper test board 26 and the lower test board 28 may couple to an upper side 10 and a lower side 12 of the printed circuit board 14 via pins 50. The upper test board 26 may move downward, as indicated by the arrow 64, so that the pins 50 couple to the upper side 10 of the printed circuit board 14. The printed circuit board 14 also may move downward, as indicated by the arrow 98, so that the pins 50 of the stationary lower test board 28 couple to the lower side 12 of the printed circuit board 14.

In accordance with embodiments of the invention, an interface board 23 may comprise a grid array of probes 22, projecting from an upper surface of the interface board, that electrically couple the interface board 23 to the lower test board 28. A grid array of interface pins 33 may couple to the interface board 23, thereby completing the electrical connection between the circuit tester 25, the interface board 23, and the test fixture 20. The interface board 23 may allow the test fixture 20 to operate with the circuit tester 25, even if the test fixture 20 and the circuit tester 25 were not specifically designed to operate together, by remapping outer pins in the grid array of pins 33 to the interior of the interface board 23. By performing this remapping, the interface board 23 may allow the test fixture 20 to have smaller dimensions than the interface board 23 and/or the circuit tester 25, thereby reducing the costs of producing the test fixture 20.

Figure 2:
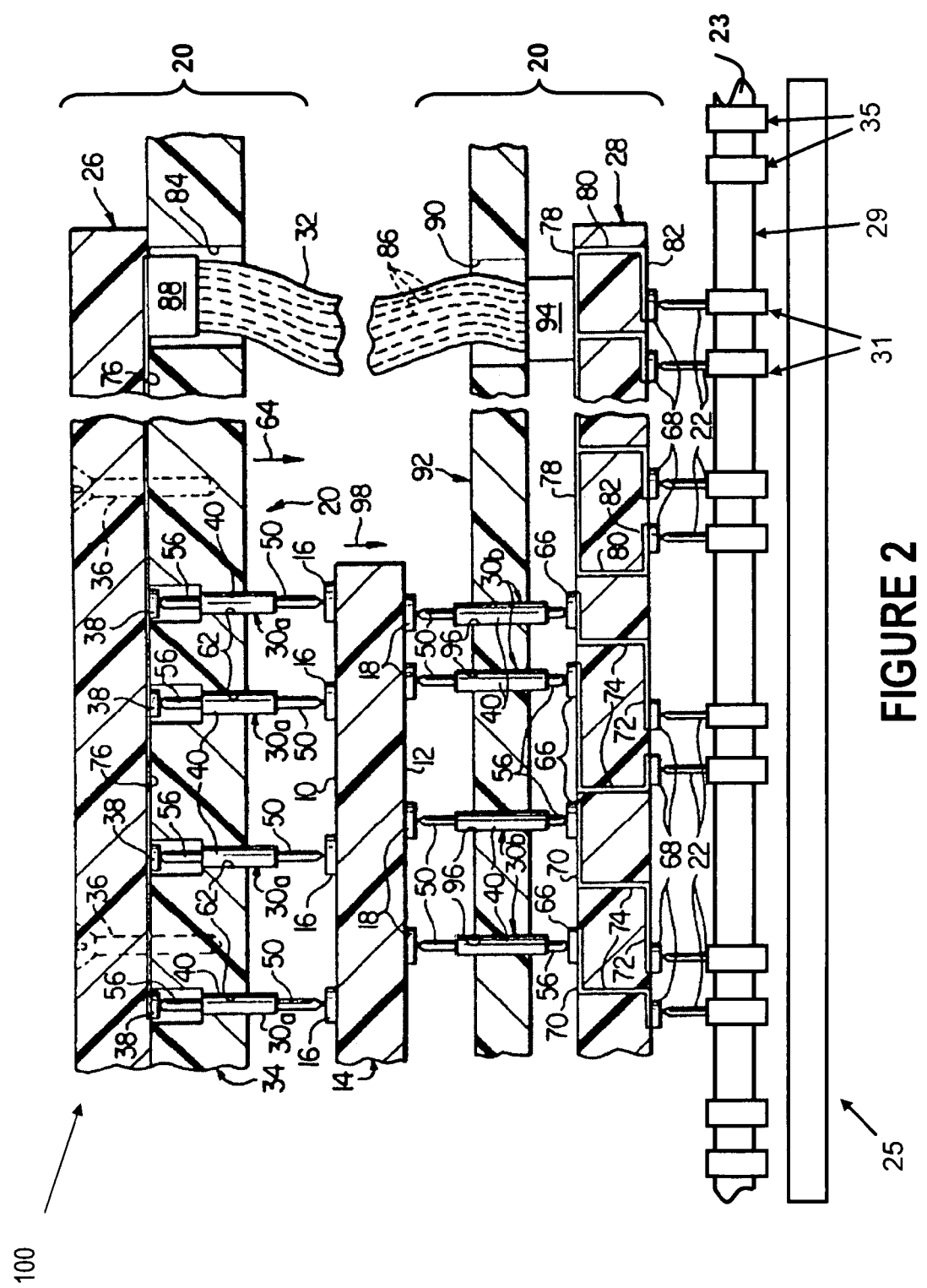
FIG. 2 illustrates a more detailed depiction of the test system of FIG. 1 in accordance with embodiments of the invention.

FIG. 2 illustrates in greater detail a portion of the exemplary test system 100 of FIG. 1. The test system 100 may provide a method and associated apparatus for performing electrical tests on the upper side 10 and lower side 12 of the printed circuit board 14 having a series of test contact points 16 and 18. The test fixture 20 may transmit and receive electrical test signals at the test contact points 16 and 18 by way of the spring-loaded probes 22 of the interface board 23. The interface board 23 may electrically contact the projecting pins 33 of the circuit tester 25 via electrically conductive barrels 31. The probes 22 may be adapted to fit inside the hollow barrels 31 so that an electrically conductive path is created between the barrels 31, the probes 22, and the pins 33. As illustrated in FIG. 2, a probe is not inserted into one or more barrels 35 located at the outer (peripheral) area of the array. The test signals associated with the outer barrels 35 may be remapped towards the center of the interface board 23 via transfer paths (not specifically shown in FIG. 2) that couple outer barrels 35 to inner barrels 31. The inner barrels 33 used for the remapped signals electrically couple to the test fixture 20 via a probe 22 but do not contact the circuit tester 25 via the grid array of interface pins 33.

In accordance with embodiments of the invention, the barrels 31 and 35 protrude from the bottom side 29 of the interface board 23 at substantially similar distances as to position the interface board 23 above and parallel to the circuit tester 25 when contact is made with the pins 33 of the circuit tester 25. Although some embodiments of the inventions described herein are directed towards interfacing the test fixture 20 with an Agilent® 3070 circuit tester, other circuit testers and test fixtures may be used.

The test fixture 20 may comprise an upper test board 26 that is disposed above and parallel to the printed circuit board 14 being tested. In addition, a lower test board 28 may be interposed between the pins 22 and the underside of the circuit board 14. An upper series of test pins 30*a* may be interposed between and transverse to the test boards 14 and 26, and a lower series of test pins 30*b* may be interposed between and transverse to the boards 14 and 28. An elongated flexible conductor strip 32 may electrically couple the upper test board 26 and the lower test board 28.

The upper test board 26 may be secured to the top side of a push-down plate 34 by screws 36 or other fastening means. The bottom side of the upper test board 26 may comprise a series of test contact points 38 which are horizontally aligned with the upper side test contact points 16 on the printed circuit board 14. Each of the electrically conductive test pins 30 may comprise an elongated hollow barrel portion 40.

As illustrated in FIG. 2, the barrel portions 40 of the upper test pins 30*a* may be anchored within cylindrical openings 62 in the push-down plate 34 in a manner such that the pin end portions 56 engage and are longitudinally compressed against the test contact points 38 on the bottom side of the upper test board 26. The axes of the pins 30*b* may be aligned with the upper side of test contact points 16 on the printed circuit board 14. The barrel portions 40 of the upper test pins 30*a* may be longitudinally positioned within the board openings 62 in a manner such that the end portions 56 of the pins 30*a* are compressed. The push-down plate 34 may be downwardly driven, as indicated by the arrow 64, to engage the downwardly projecting end portions 50 of upper pins 30*a* against the upper side test contact points 16 and upwardly compress the pin portions 50.

The lower test board 28 may be stationary and have upper side test contact points 66 which are positioned below the lower side test contact points 18 on the printed circuit board 14. The lower test board 28 may also comprise a series of test contact points 68, which engage and vertically compress the test pins 22. The upper and lower faces of the test contact points 66 and 68, respectively, may be interconnected by printed circuitry 70 and 72 that extends along the upper and lower side surfaces of the lower test board 28. The upper and lower faces of the contact points 66 and 68 may be interconnected through the lower test board 28 by vertically extending "vias" 74.

Each of the test contact points 38 on the upper board 26 may be connected to one of a series of printed circuit transfer paths 76 extending along the lower side surface of the upper test board 26. Additionally, printed circuit transfer paths 78 may be formed along the upper side surface of the lower test board 28. The transfer paths 78 may couple to one or more of the lower test contact points 68 by means of vertically extending vias 80 and printed transfer circuitry 82 extending along the bottom side of the lower test board 28.

An upper end of the flexible conductor strip 32 may extend upwardly through an opening 84 in the push-down plate 34, with the individual etched circuits 86 of the flexible printed circuit member 32 being connected at their upper ends with the printed circuit transfer paths 76 by means of a connector 88. In a similar fashion, a lower end portion of the flexible printed circuit member 32 may extend downwardly through an opening 90 in a stationary supported probe plate 92, which is interposed between and parallel to the printed circuit board 14 and the lower test board 28. The lower ends of the etched circuits 86 may operatively connect to the printed circuit transfer paths 78 by means of a connector 94.

The barrel portions 40 of the lower test pins 30*b* may be anchored within a series of openings 96 in the stationary probe plate 92, and the downwardly projecting pin end portions 56 of the lower pins 30*b* may be held and longitudinally depressed against the upper side test contact points 66 on the lower test board 28 with pin portions 56. When the push-down plate 34 is downwardly moved, as indicated by the arrow 64, the printed circuit board 14 may also move downward, as indicated by the arrow 98, to cause the lower side test contact points 18 on the printed circuit board 14 to engage the pin end portions 50 of the lower test pins 30*b*.

With the illustrative portions of the test fixture 20 in their testing position, (as depicted in FIG. 2) electrical test signals sent and received by way of the lower side test contact points 18 on the printed circuit board 14 may be routed to their associated pins 22 on the interface board 23 through the lower test pins 30*b*, the upper side test contact points 66 on the lower test board 28, the printed circuitry 70, the vertically extending vias 74, the bottom side printed circuitry 72, and the bottom side test contact points 68 on the lower test board 28.

The electrical test signals sent and received by way of the top side test contact points 16 on the printed circuit board 14 may be routed to their associated pins 22 through the upper test pins 30*a*, the bottom side test contact points 38 on the upper test board 26, the printed circuit transfer paths 76 on the underside of the upper test board 26, the etched circuits 86 in the flexible printed circuit member 32, the printed circuit transfer paths 78 on the upper side of the lower test board 28, the vertically extending vias 80, the printed transfer circuitry 82 on the underside of the lower test board 28, and the lower side test contact points 68.

The interface board 23 may facilitate the transmission of test signals between the circuit tester 25 and the test fixture 20 though electrically conductive inner barrels 31 that are positioned beneath the lower side test contact points 68. The inner barrels 31 may be adapted to hold the spring-loaded probes 22 that electrically contact the lower side test contact points 68. In addition to the barrels 31, the interface board 32 may be adapted to hold the outer barrels 35. One or more outer barrels 35 may be remapped to an inner barrel 31. Although similar in height to the barrels 31, the barrels 35 need not be coupled to a probe. The barrels 31 and 35 may protrude from the bottom 29 of the interface board 23 at substantially similar distances and electrically contact the even-leveled pins 33 of the circuit tester 25. The inner barrels 31 that are used for remapping the outer barrels 35 may electrically contact the lower side test contact points 68 via the spring-loaded probes 22, but need not contact the pins 33 of the circuit tester 25.

Figure 3:
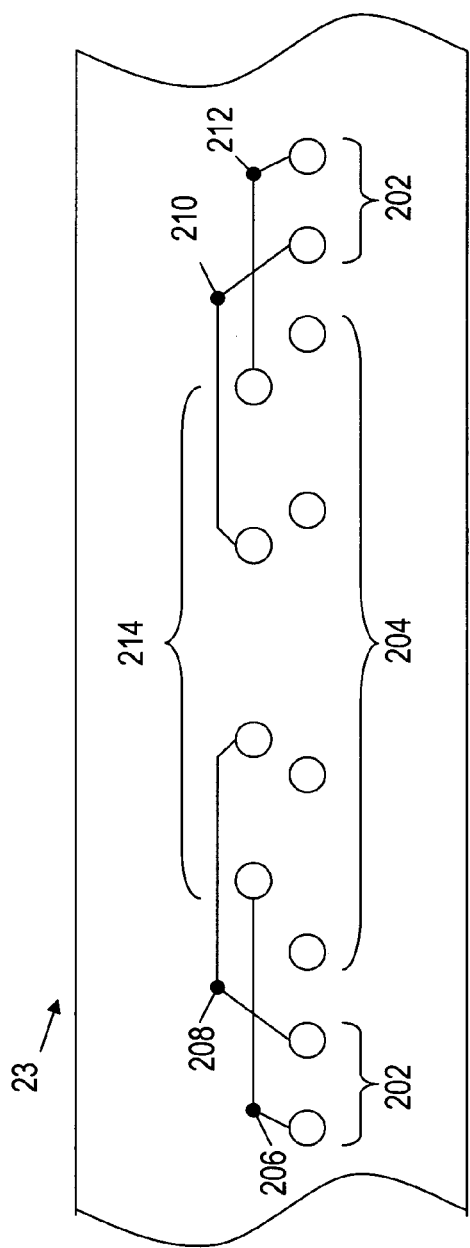
FIG. 3 illustrates a first top-down view of the interface board of FIG. 2 in accordance with embodiments of the invention.

Referring now to FIG. 3, a top-down view of an exemplary portion of the interface board 23 is shown in accordance with embodiments of the invention. The barrels 31 and 35 (FIG. 2) may be disposed in holes that are positioned vertically above each pin 33 of the circuit tester 25 (FIG. 2). The barrels 35 of FIG. 2 may be disposed in outer holes 202, and the barrels 31 of FIG. 2 may be disposed in inner holes 204. Since the barrels 35 do not interface with the test fixture 20 via a probe, a printed circuit board transfer path may be etched into the interface board 23 to remap test signals to and from the barrels 35 toward the center of the interface board 23. The transfer paths 206, 208, 210, and 212 may couple the four outer holes 202 to four remap holes 214 that overlie areas of the circuit tester 25 at which pins 33 are not located, and are located towards the center of the interface board 23. In operation, the transfer paths 206, 208, 210, and 212 may remap the test signals from the barrels 35 that are inserted in the outer holes 202 to the selected barrels 31 that are inserted in the inner holes 214. The interface board 23 may interact with the test fixture 20 via the probes 22 that are inserted in the barrels 31, thereby completing the electrical interface between the circuit tester 25 and the test fixture 20. Test signals, emanating from the circuit tester 25, may be routed through the pins 33, the barrels 31, and the probes 22 that contact the lower contact points 68 of the test-fixture 20. In addition, test signals may be routed through the pins 33, the barrels 35, the transfer paths 206, 208, 210, and 212, the barrels 31, and the probes 22 that contact the lower contact points 68 of the test fixture 20.

Figure 4:
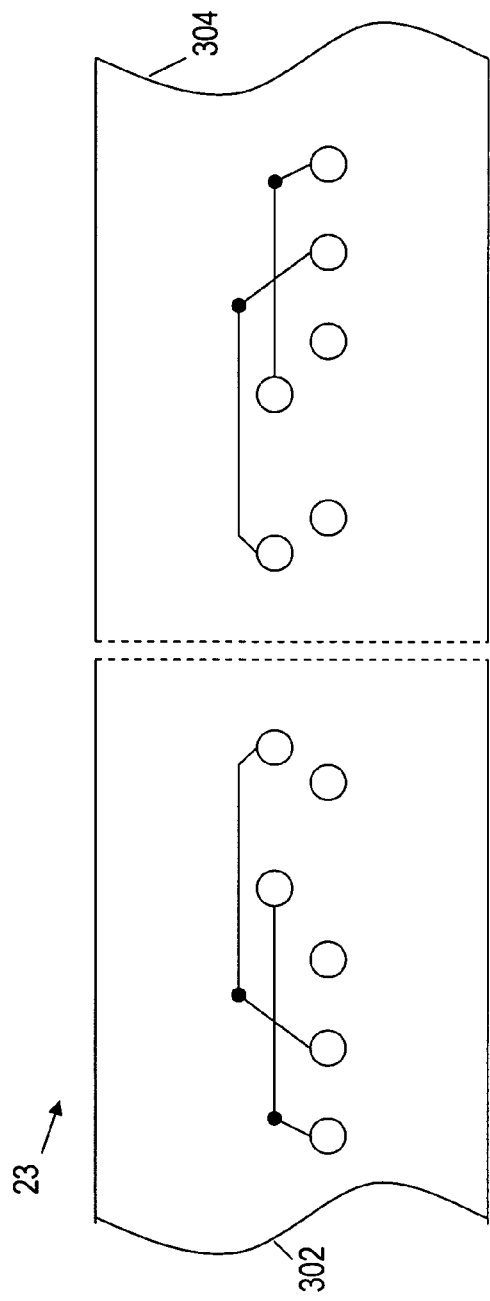
FIG. 4 illustrates a second top-down view of the interface board of FIG. 2 in accordance with embodiments of the invention.

Although a single interface board is depicted in FIGS. 1, 2, and 3, the interface board 23 may be divided into multiple interface boards. For example, the interface board 23 may comprise a left half 302 and a right half 304, as shown in FIG. 4. The two interface boards 302 and 304 may collectively operate in a similar manner as the interface board 23. The smaller dimensions of the left and right halves 302 and 304, respectively, may reduce the costs associated with producing the interface board 32.

Figure 5:
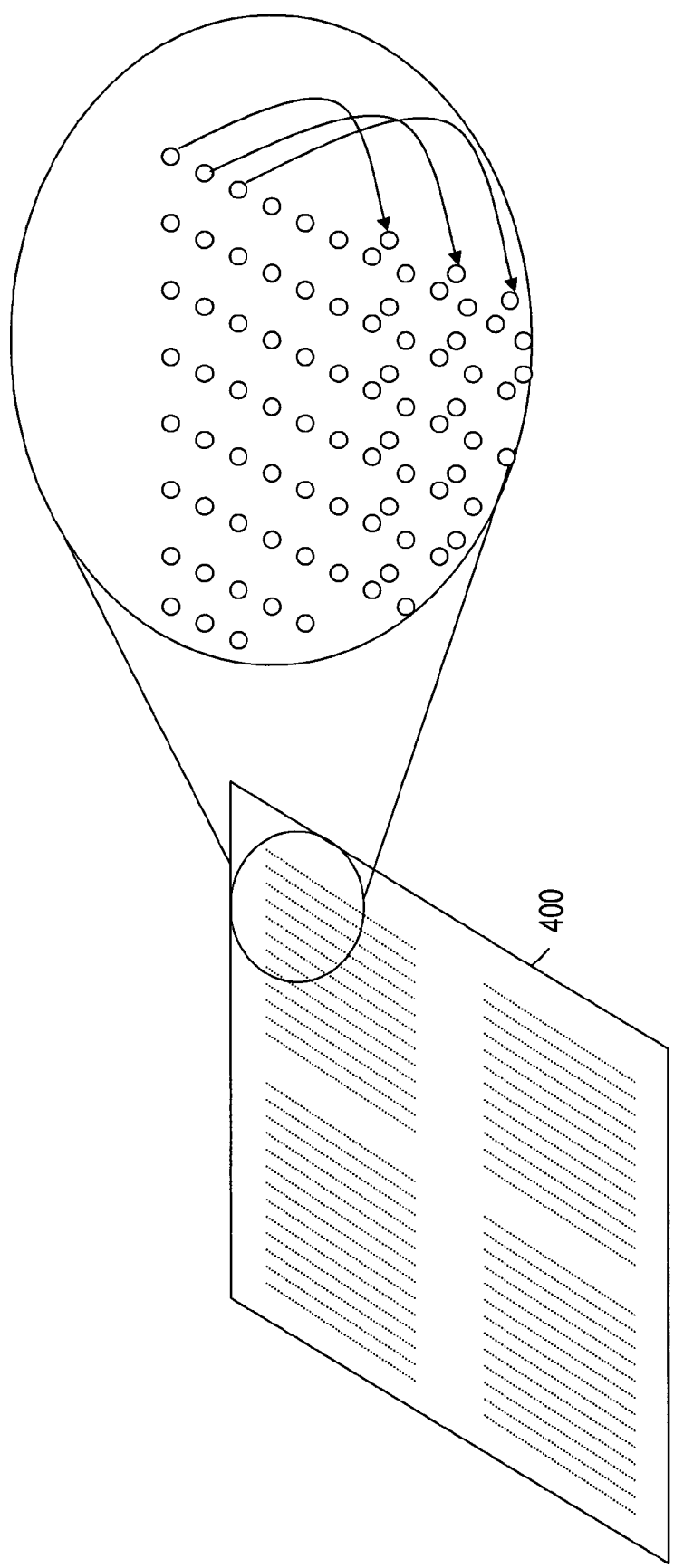
FIG. 5 illustrates an interface board in accordance with embodiments of the invention.

Referring now to FIG. 5, an exemplary interface board is shown in accordance with embodiments of the invention. The interface board 400 may comprise a plurality of holes designed to hold electrically conductive barrels. Although any number of outer barrels may be remapped, the exemplary interface board 400 may remap three outer barrels of each pin line to an inner barrel via transfer paths. In FIG. 5, arrows depict which inner barrels the outer barrels have been remapped. The holes that hold the inner barrels for the remapped signals are shown offset from the holes in the main inner grid so that they are not aligned over pins 33 of the circuit tester 25. Probes may be loaded into all of the inner barrels to electrically contact the test fixture. Probes need not be loaded into the outer barrels, as the signals associated with the outer barrels are remapped to the selected inner barrels. The interface board 400 may be divided horizontally or vertically, as previously discussed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit tester interface board comprising,
    a plurality of outer holes, wherein an electrically conductive barrel is disposed in each outer hole, each electrically conductive barrel protrudes from a bottom of the interface board, and wherein each electrically conductive barrel is configured to electrically couple to a circuit tester;
    a first plurality of inner holes, wherein an electrically conductive barrel with a probe is disposed in each of the first plurality of inner holes, wherein the probe of each conductive barrel extends from a top of the interface board, wherein each electrically conductive barrel protrudes from the bottom of the interface board, and wherein each electrically conductive barrel is configured to directly electrically couple to the circuit tester;
    a second plurality of inner holes proximate to the first plurality of inner holes, wherein an electrically conductive barrel with a probe is disposed in each inner hole, the probe extending from the top of the interface board;
    a plurality of electrical transfer paths coupling each barrel disposed in the plurality of outer holes to selected barrels disposed in the first plurality of inner holes; and
    wherein each electrically conductive barrel disposed in the second plurality of inner holes couples to the circuit tester through a barrel of an outer hole.

2. The circuit tester interface board of claim 1 wherein the interface board comprises a plurality of interface boards.

3. The circuit tester interface board of claim 1 wherein the probes couple to a test fixture.

4. The circuit tester interface board of claim 1 wherein the plurality of inner and outer holes comprises a grid array of holes.

5. An apparatus comprising:
    a circuit tester interface board comprising
        a first plurality of inner holes;
        a second plurality of inner holes; and
        a plurality of outer holes,
    a plurality of barrels coupled one each in each of the first and second plurality of inner holes, each barrel comprising a probe;
    a plurality of barrels coupled one each in each of the plurality of outer holes; and
    electrical traces that couple the plurality of barrels of the second plurality of inner holes one each to the barrels of the plurality of outer holes;
    wherein the barrels of the first plurality of inner holes couple to a circuit tester, and wherein the barrels of the second plurality of inner holes couple to the circuit tester by way of the barrels of the plurality of outer holes.

6. The apparatus as defined in claim 5 wherein the barrels of the first plurality of inners holes couple directly to the circuit tester.

7. The apparatus as defined in claim 5 wherein the barrels of the plurality of outer holes couple directly to the circuit tester.

* * * * *